US011277906B2

(12) United States Patent
Leermakers et al.

(10) Patent No.: US 11,277,906 B2
(45) Date of Patent: Mar. 15, 2022

(54) SEPARABLE MODULES PCB MODULES

(71) Applicant: SIGNIFY HOLDING B.V., Eindhoven (NL)

(72) Inventors: Remco Christianus Wilhelmus Leermakers, Tiburg (NL); Frank Walterus Marie Van Kempen, Echt (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 17/281,916

(22) PCT Filed: Oct. 7, 2019

(86) PCT No.: PCT/EP2019/077025
§ 371 (c)(1),
(2) Date: Mar. 31, 2021

(87) PCT Pub. No.: WO2020/074414
PCT Pub. Date: Apr. 16, 2020

(65) Prior Publication Data
US 2021/0385945 A1 Dec. 9, 2021

(30) Foreign Application Priority Data

Oct. 11, 2018 (EP) ........................................ 8199964

(51) Int. Cl.
*H05K 1/02* (2006.01)
*H05K 3/36* (2006.01)

(52) U.S. Cl.
CPC ......... *H05K 1/0278* (2013.01); *H05K 1/0293* (2013.01); *H05K 3/368* (2013.01);
(Continued)

(58) Field of Classification Search
CPC ..... H05K 1/0277–0283; H05K 1/0293; H05K 3/005; H05K 3/0052; H05K 2203/0221
See application file for complete search history.

(56) References Cited

U.S. PATENT DOCUMENTS 3,780,431 A 12/1973 Feeney
2016/0298834 A1 10/2016 Baker et al.

FOREIGN PATENT DOCUMENTS

CN 201652026 U 11/2010
CN 202017945 U 10/2011
(Continued)

*Primary Examiner* — Jeremy C Norris
(74) *Attorney, Agent, or Firm* — Daniel J. Piotrowski (57) ABSTRACT

The invention provides a printed circuit board (10) including a first electrically conductive track (210), wherein the printed circuit board (10) comprises a set (15) of two printed circuit board areas (100) both comprising a part of the first electrically conductive track (210), wherein printed circuit board (10) further comprises a perforation line (300) between the two printed circuit board areas (100) for customizing the printed circuit board (10) into two physically separated printed circuit board area comprising parts (1100), wherein the perforation line (300) is configured as a non-straight line, wherein the perforation line (300) comprises relative to one of the printed circuit board areas (100), and in a plane of the printed circuit board (10), a first projecting part (311) and a first recessed part (312), wherein the first recessed part (312) is recessed relative to the first projecting part (311), wherein the first electrically conductive track (210) is intercepted by the perforation line (300) at the first recessed part (312).

15 Claims, 3 Drawing Sheets

(52) U.S. Cl.
CPC ............... *H05K 2201/0909* (2013.01); *H05K 2201/09036* (2013.01); *H05K 2201/09063* (2013.01); *H05K 2201/09127* (2013.01); *H05K 2201/10106* (2013.01); *H05K 2203/302* (2013.01)

(56) References Cited

FOREIGN PATENT DOCUMENTS

| | | | |
|---|---|---|---|
| CN | 102297388 | A | 12/2011 |
| DE | 102015004339 | B4 | 9/2017 |
| JP | S4942458 | U | 4/1974 |
| JP | S5072956 | A | 6/1975 |
| JP | S59149652 | A | 8/1984 |
| JP | S59192859 | A | 11/1984 |
| WO | 2008134809 | A1 | 11/2008 |
| WO | 2017116544 | A1 | 7/2017 |
| WO | 2018081842 | A1 | 5/2018 |

SEPARABLE MODULES PCB MODULES

CROSS-REFERENCE TO PRIOR APPLICATIONS

This application is the U.S. National Phase application under 35 U.S.C. § 371 of International Application No. PCT/EP2019/077025, filed on Oct. 7, 2019, which claims the benefit of European Patent Application No. 18199964.0, filed on Oct. 11, 2018. These applications are hereby incorporated by reference herein.

FIELD OF THE INVENTION

The invention relates to a printed circuit board (PCB), to a kit of parts comprising such printed circuit board, and to a method of functionally coupling printed circuit board area comprising parts.

BACKGROUND OF THE INVENTION

The use of perforated printed circuit boards (PCBs) is known in the art. U.S. Pat. No. 3,780,431, for instance, describes a pallet which is made up of a number of printed circuit boards, the boards being perforated at their interconnected edges whereby each printed circuit board can be easily snapped apart at a selected stage of assembly. In an embodiment, the printed circuit board sections are connected in groups of three, four or more to form a pallet. These printed circuit board sections will all be identically processed to form the same calculator circuit when the assembly procedure is completed. However, for accuracy of assembly, increasing the speed, and making assembly more convenient the four sections comprising printed circuit boards are simultaneously carried as an interconnected unit through the successive stations of assembly. It should be noted that the pallet has perforated sections which permit each printed circuit board section to be snapped apart one from the other along the perforations and there is an occasional elongated opening so that when the board sections are broken apart there will be formed notches along the edges of the boards which serve as means for locating and connecting the boards within the interior of the casing of the calculator. Thus, the pallet comes preformed with the printed circuitry, the perforations which are the breakage points for the boards and the openings to form the necessary notched areas which serve to locate and secure the printed circuit board in place.

SUMMARY OF THE INVENTION

The above cited prior art does essentially not provide a scalable system, but provides identical independent PCBs that are interconnected. However, there may be a desire to provide and/or use a scalable system. Further, printed circuit boards include electrically conductive tracks. Dependent upon the construction of the PCB, in the case of a scalable system, the electrically conductive tracks may become accessible to other parts when scalable system is reduced in dimension (and used in a device). Hence, prior art systems do not provide the desired solutions for practical applications. Hence, it is an aspect of the invention to provide an alternative printed circuit board, which preferably further at least partly obviates one or more of above-described drawbacks. The present invention may have as object to overcome or ameliorate at least one of the disadvantages of the prior art, or to provide a useful alternative.

Hence, in an aspect the invention provides a printed circuit board (PCB) including a first electrically conductive track, wherein the printed circuit board comprises a set of two printed circuit board areas both comprising a part of the first electrically conductive track ("first track" or "first conductive track"), wherein the printed circuit board further comprises a perforation line between the two printed circuit board areas (for customizing the printed circuit board into two physically separated printed circuit board area comprising parts), wherein the perforation line comprises relative to one of the printed circuit board areas, and in a plane of the printed circuit board, a first projecting part and a first recessed part, wherein the first recessed part is recessed relative to the first projecting part, wherein the first electrically conductive track is intercepted by the perforation line at the first recessed part. Hence, in embodiments the perforation line is configured as a non-straight line.

Such PCB allows an improved stock management, as a large PCB may be stored, and, when desired, one or more PCB areas may be snapped away to provide a PCB (module) (smaller than the PCB from which it was snapped away), e.g. for use in a (lighting) system. Further, such PCB allows snapping away PCB elements that are at least to some extend protected from short circuiting due to undesired contact with electrically conductive elements in a system wherein the PCB element is applied. This protection may be provided by the fact that the electrically conductive track ends at a recessed part and adjacent therefrom a projecting part is available. The latter part may facilitate reduction of the chance that the conductive track, which is now accessible at the edge of the snapped away PCB comprising part or of the remaining PCB of which the PCB area comprising part was snapped away), comes into undesired contact with another electrically conductive element, such as an earth. Further, in embodiments such PCB allows scalability, as the larger unit may be used as such, but may also be divided in two (or more) snapped away PCB modules, that may also be functionally used. Hence, the present invention provides separable PCB modules.

As known in the art, a printed circuit board may mechanically support and electrically connect electronic components or electrical components using conductive tracks, pads and other features etched from one or more sheet layers of copper laminated onto and/or between sheet layers of a non-conductive substrate (shortly indicated as "track" or "conductive track"). Components are generally soldered onto the PCB to both electrically connect and mechanically fasten them to it. For instance, a basic PCB may consist of a flat sheet of insulating material and a layer of copper foil, laminated to the substrate. Chemical etching divides the copper into separate conducting lines called tracks or circuit traces, pads for connections, vias to pass connections between layers of copper, and features such as solid conductive areas for EM shielding or other purposes. The tracks function as wires fixed in place, and are insulated from each other by air and the board substrate material. The surface of a PCB may have a coating that protects the copper from corrosion and reduces the chances of solder shorts between traces or undesired electrical contact with stray bare wires. For its function in helping to prevent solder shorts, the coating is called solder resist.

Hence, the shape of a PCB is in general plate-like. Especially, in embodiments the PCB may have a length and a width and a height, wherein an aspect ratio of the length and the height is at least 5, like in the range of 5-5000, like 10-2500, and wherein an aspect ratio of the width and the height is at least 2, such as an aspect ratio of at least 5, like in the range of 5-5000, like 10-2500. The terms "length", "width", and "height" may also refer to "largest length", "largest width", and "largest height", respectively. The PCB may especially have a rectangular cross-section (such as a square cross-section).

The height (or thickness) of the PCB may in embodiments be selected from the range of 0.2-10 mm, such as 0.5-5 mm, like 1-2 mm. The width of the PCB may in embodiments be selected from the range of 5-200 mm, such as 5-50 mm. The length of a single printed circuit board area may in embodiments e.g. be selected from the range of 10-50 mm, such as 15-40 mm. The length of the PCB, including a plurality of (connected) PCB areas, may in embodiments e.g. be selected from the range of 20-2000 mm, such as 20-1500 mm. Other dimensions may be possible as well.

Especially, in embodiments the individual PCB areas of the PCB all have the same length (and height and width). PCB area comprising parts may have lengths which are (essentially) equal to an integer times the length of an individual PCB area. Instead of the term "PCB area", also the term "PCB module" may be applied.

Herein, the term "in a plane" and similar terms, refer(s) to a cross-sectional plane perpendicular to the height, and in general parallel to a bottom face and parallel to a top face of the PCB, and in general perpendicular to one or more edges of the PCB. The bottom face and top face define the thickness or height of the PCB. Electronic components are not included in the height; the phrase "height of the PCB" and similar phrases refer to height of the PCB only.

As indicated above, the invention provides a printed circuit board including a first electrically conductive track, wherein the printed circuit board comprises a set of two (functional) printed circuit board areas both comprising a part of the first electrically conductive track.

Herein, the invention is amongst others described with reference to two printed circuit board areas. These two printed circuit board areas are herein also indicated as "first printed circuit board area" and "second printed circuit board area", respectively, or as "one of the printed circuit board areas" and the "other of the printed circuit board areas", respectively. However, the printed circuit board may also comprise three or more printed circuit board areas. Hence, in embodiments the printed circuit board comprises a plurality of sets of two printed circuit board areas. The plurality of printed circuit board areas may in embodiments be configured as 1D array of printed circuit board areas. The PCB may e.g. comprise two or more, such as four or more, such as 10 or more, like 10-100 of the printed circuit board areas, such as 24-48, though more (than 100) may also be possible. Therefore, in embodiments the printed circuit board comprises a 1D array of printed circuit board areas.

Further, the printed circuit board comprises a (first) conductive track of which part is comprised by the first printed circuit board area and of which part is comprised by the second printed circuit board area. Assuming there are three printed circuit board areas, then in principle there may be defined two sets of printed circuit board areas. Each set of printed circuit board areas may share parts of an (first) electrically conductive track, though this is not necessarily the same (first) electrically conductive track for each of the sets. In embodiments, however, each set comprises a (different) part of the (same) (first) electrically conductive track.

In general, there is not a single electrically conductive track, but there are at least two electrically conductive tracks. Hence, in embodiments the printed circuit board comprises a (second) conductive track of which part is comprised by the first printed circuit board area and of which part is comprised by the second printed circuit board area. Assuming there are three printed circuit board areas, then in principle there may be defined two sets of printed circuit board areas. Each set of printed circuit board areas may share parts of an (second) electrically conductive track, though this is not necessarily the same (second) electrically conductive track for each of the sets. In embodiments, however, each set comprises a (different) part of the (same) (second) electrically conductive track.

Hence, the term "electrically conductive track" may also refer to a plurality of electrically conductive tracks. For the sake of understanding, herein a first electrically conductive track and a second electrically conductive track are defined, but unless indicated otherwise or apparent from the description (or drawings) (to a person skilled in the art), all embodiments in relation to the first electrically conductive track may also apply to the second electrically conductive track. When the terms "electrically conductive track" or "conductive track" or "track" are applied, without being preceded by "first" or "second", it may be referred to electrically conductive tracks in general, i.e. the first electrically conductive track and any further available electrically conductive track that is shared by at least two PCB areas.

As indicated above, for the sake of understanding, herein a first electrically conductive track and a second electrically conductive track are defined. The use of these terms may especially refer to embodiments wherein there is only electrical connection between the first electrically conductive track and the second electrically conductive track via a functional component, such as a solid state light source, an IC, a transistor (see also below).

Especially, each of the printed circuit board areas is a functional printed circuit board area. Herein, the term "functional printed circuit board area" refers to a printed circuit board area to which a functional component is (functionally) attached. Such functional component will be functionally coupled to the first electrically conductive track (and the second electrically conductive track).

The functional component is thus especially an electrical (functional) component or electronic (functional) component. The electronic component may include an active or a passive electronic component. An active electronic component may be any type of circuit component with the ability to electrically control electron flow (electricity controlling electricity). Examples thereof are diodes, especially light emitting diodes (LED). LEDs are herein also indicated with the more general term solid state lighting devices or solid state light sources. Hence, in embodiments the electronic component comprises an active electronic component. Especially, the electronic component comprises a solid state light source. Other examples of active electronic components may include power sources, such as a battery, a piezo-electric device, an integrated circuit (IC), and a transistor. In yet other embodiments, the electronic component may include a passive electronic component. Components incapable of controlling current by means of another electrical signal are called passive devices. Resistors, capacitors, inductors, transformers, etc. can be considered passive devices. In an embodiment, the electronic component may include an RFID (Radio-frequency identification) chip. A RFID chip may be passive or active. Especially, the electronic component may include one or more of a solid state light source (such as a LED), a RFID chip, and an IC. The term "electronic component" may also refer to a plurality of alike or a plurality of different electronic components.

In embodiments, the functional component comprises a light source, especially a solid state light source. The term "light source" may refer to a semiconductor light-emitting device, such as a light emitting diode (LEDs), a resonant cavity light emitting diode (RCLED), a vertical cavity laser diode (VCSELs), an edge emitting laser, etc. The term "light source" may also refer to an organic light-emitting diode, such as a passive-matrix (PMOLED) or an active-matrix (AMOLED). In a specific embodiment, the light source comprises a solid state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. The term "light source" may also relate to a plurality of light sources, such as 2-2000 solid state light sources.

In embodiments, each PCB area has the same functionality. In this way, the PCB may be scalable, or down scalable, in the sense that PCB areas can be removed from the PCB, leading to two physically separated printed circuit board area comprising parts. These two physically separated printed circuit board area comprising parts may essentially have the same functionality (e.g. in embodiments providing light with specific optical properties like color point, color temperature, and color rendering index). Herein, the term "printed circuit board area comprising parts" is used, as the part that may be snapped away from the PCB may include a plurality of PCB areas and/or may in specific embodiments comprise other parts.

To be able to snap away a PCB area (or printed circuit board area comprising parts), between the PCB areas there is provided a perforation line. This allows breaking a PCB area (or printed circuit board area comprising part) away from the one or more other PCB areas (or printed circuit board area comprising parts). Perforation lines are known in the art. A perforation line may include holes, especially through holes, in the PCB allowing to by apply e.g. force a relatively controlled separation of a first PCB area from an adjacent second PCB area. Instead of the term "perforation line", also the terms "mouse bites" or "breakaway tabs" may be used. Especially, in embodiments the diameters of the holes are selected from the range of 0.2-5 mm, such as 0.5-2 mm. The hole pitch may in embodiments be selected from the range of 1.2-4 times the hole diameter, such as 1.25-2 times the hole diameter. For instance, in embodiments the diameter of the holes is selected from the range of 0.8-1.2 mm and the pitch is selected from the range of 1.4-2 mm.

The perforation line may include holes. However, in addition to the holes the perforation line may also include other shapes. For instance, the perforation line may further include channels (such as elongated holes), for instance between the projecting part of the one PCB area and the other PCB area (and the other way around).

Alternatively or additionally to the perforation line, the PCB may include a V-groove scoring. Especially, the invention is herein described in relation to a perforation line. Hence, the perforation line is an embodiment of an element that allows a (controlled) breaking away of a PCB comprising area from another PCB comprising area (or PCB). Further, the perforation line is an embodiment of an element that allows a scaling down of a PCB, while the not scaled down PCB as well as the broken away PCB comprising area may functionally be used, as the PCB essentially comprises a plurality of PCB areas that are functionally coupled (via the electrically conductive track(s).

Herein, the invention is especially further described in relation to a perforation line.

The use of a perforation line has as advantage that the electrically conductive track(s) is not interrupted in such a way that electrical conductivity is blocked. The electrical conductivity is maintained between both sides of the perforation line, allowing the functional use of both the PCB areas at both sides of the perforation line. Nevertheless, such perforation line also allows a relatively controlled snapping away of a first PCB area from an adjacent second PCB area. Hence, the perforation line does not (fully) interrupt the electrically conductive track, but intercepts the electrically conductive track (without essentially affecting its functionality). As the perforation line may include a plurality of holes, the holes interrupt the conductive track, but the areas between two holes provide effectively an uninterrupted electrically conductive track.

Hence, the printed circuit board further comprises a perforation line between the two printed circuit board areas. This perforation line allows customizing the printed circuit board into two physically separated printed circuit board area comprising parts.

By snapping away a PCB area or PCB area comprising part, part of the electrically conductive track becomes accessible at edge of the PCB area. This may impose risks, such as short circuit, etc. Hence, the present invention may provide a protection against such risks.

In embodiments, the perforation line comprises relative to one of the printed circuit board areas, and in a plane of the printed circuit board, a first projecting part and a first recessed part, wherein the first recessed part is recessed relative to the first projecting part, wherein the first electrically conductive track is intercepted by the perforation line at the first recessed part.

Hence, the perforation line is especially configured as a non-straight line. Such line may have curves, angles, zig-zag structures, etc.

When two adjacent PCB areas are snapped away from each other, the two PCB areas will have complementary shapes. For instance, a projection at one area has a corresponding recession at the other part; a concave shape at one area has a corresponding convex shape at the other part.

By choosing the shape of the perforation line, it can be achieved that the conductive track at an edge of a PCB area is configured in the plane of the PCB (area) recessed relative to one or more projecting parts of the same PCB area. Both the recessed part and projection part are configured in the plane of the PCB (area), and especially have the same height as the remainder of the PCB area. Hence, the perforation line defines the recessed part(s) and the protruding part(s) of both the PCB areas that are separated by the projection line.

Especially, for a conductive track there is a recessed part at the perforation line with at least one, more especially at least two protruding parts, between which the recessed part is available where the conductive track is intercepted by the perforation line.

Hence, in embodiments the PCB may comprise a plurality of first projecting parts (in the plane of the printed circuit board), wherein the first electrically conductive track is intercepted by the perforation line at the first recessed part between two first projecting parts.

Likewise, in embodiments the PCB may comprise a plurality of first projecting parts (in the plane of the printed circuit board), wherein the second electrically conductive track is intercepted by the perforation line at the first recessed part between two first projecting parts (see also below).

For an effective protection of the edge of the PCB area with the electrically conductive track (that has become accessible at the edge due to snapping away the adjacent PCB area), the protrusion may have a predefined length, and when two protrusions are applied between which the recession is configured, an inter distance may have a predefined distance.

Therefore, in embodiments the printed circuit board has a width (W), wherein the two first projecting parts have a shortest distance (W11), wherein the shortest distance (W11) complies with the following conditions: (i) W11<W, and (in further specific embodiments) (ii) W11≤25 mm. In general, however, the shortest distance (W11) may be at least 0.5 mm. In embodiments, W11≤20 mm. For instance, in embodiments W11≤10 mm, like 0.5-10 mm.

Alternatively or additionally, the printed circuit board has a width (W), wherein the first projecting part has a projection length (L11) (in the plane of the printed circuit board) relative the first recessed part (which is recessed relative to that first projecting part), wherein in embodiments the projection length (L11) complies with at least one of the following conditions: (i) L11≥0.5 mm, and (ii) L11≥0.1*W. In general, however, the projection length (L11) may be at maximum 5 cm, such as at maximum about 10 mm. In specific embodiments, L11≥1.5 mm. Hence, in further specific embodiments, the projection length (L11) complies with at least one of the following conditions: (i) L11≥1.5 mm, and (ii) L11≥0.1*W.

Above, the embodiments of the recession(s) and/or protrusion(s) may especially have been defined in relation to one of the PCB areas (a first PCB area). However, the same may apply to the other of the two PCB areas that are separated by the shared perforation line. Hence, the perforation line may be shaped such, that even when a protruding part at the other of the PCB areas provides a recession part at the one of the two PCB areas, such protruding part at the other of the PCB areas may nevertheless be recessed relative to one or more other protruding parts at the other of the two PCB areas.

The perforation line comprises in a plane of the printed circuit board and relative to the other of the printed circuit board areas, a second projecting part and a second recessed part, wherein the second recessed part is recessed relative to the second projecting part, wherein the first electrically conductive track is intercepted by the perforation line at the second recessed part, wherein the first recessed part and the second recessed part share the same part of the perforation line. Hence, the first recessed part at the one PCB area and the first recessed part at the other of the PCB areas (which are separated by the perforation line), are both recessed relative to one or more protruding parts of the respective PCB areas. With such printed circuit board the electrically conductive tracks become less (or not) accessible to other parts when scalable system is reduced in dimension (and used in a device). Thus the electrically conductive tracks at the one PCB area and at the other of the PCB areas (which are separated by the perforation line) become both less (or not) accessible to other parts when scalable system is reduced in dimension (and used in a device). Above mentioned measure will improve the safety when using such printed circuit board. Therefore, in specific embodiments the other of the printed circuit board areas comprises a plurality of second projecting parts, wherein the first electrically conductive track is intercepted by the perforation line at the second recessed part between two second projecting parts (of the other of the printed circuit board areas).

Likewise as defined above in relation to the first projecting part(s) and the first recessed part, also the above indicated dimensions may apply to the second projecting part(s) and the second recessed part. Hence, in embodiments the printed circuit board has a width (W), wherein the two second projecting parts have a shortest distance (W21), wherein the shortest distance (W21) complies with the following conditions: (i) W21<W, and (in further specific embodiments) (ii) W21≤25 mm. In general, however, the shortest distance (W21) may be at least 0.5 mm. In embodiments, W21≤20 mm. For instance, in embodiments W21≤10 mm, like 0.5-10 mm.

Alternatively or additionally, the printed circuit board has a width (W), wherein the second projecting part has a projection length (L21) (in the plane of the printed circuit board) relative the second recessed part (which is recessed relative to that second projecting part), wherein in specific embodiments the projection length (L21) complies with at least one of the following conditions: (i) L21≥01.5 mm, and (ii) L21≥0.1*W. In general, however, the projection length (L21) may be at maximum 5 cm, such as at maximum about 10 mm. In specific embodiments, L21≥1.5 mm. Hence, in further specific embodiments, the projection length (L11) complies with at least one of the following conditions: (i) L21≥1.5 mm, and (ii) L21≥0.1*W.

As indicated above, the PCB may comprise a second electrically conductive track. Such second electrically conductive track may be arranged in such a way, that at the same first recessed part (and optionally at the same second recessed part) the second electrically conductive track proceeds from one PCB area to the other PCB area. Alternatively, however, the second electrically conductive track proceeds from one PCB area to the other PCB area via another first recessed part at the one PCB area. Such another first recessed part is herein also indicated as "further first recessed part".

Hence, in embodiments the printed circuit board may further comprise a second electrically conductive track, different from the first electrically conductive track, wherein the set of two (functional) printed circuit board areas both comprise a part of the second electrically conductive track, wherein the second electrically conductive track is intercepted by the perforation line at (i) the first recessed part (see also above) or (ii) at a further first recessed part relative to one of the printed circuit board areas, and in a plane of the printed circuit board, wherein the further first recessed part is configured spatially separate from the first recessed part.

Above, the embodiment in relation to the second electrically conductive track being intercepted by the perforation line at (i) the first recessed part has been discussed in a bit more detail. In relation to the second electrically conductive track being intercepted by the perforation line at (ii) at a further first recessed part relative to one of the printed circuit board areas, it may in embodiments be the case that the further first recessed part is adjacent to yet another further second recessed part. Therefore, in embodiments the printed circuit board may further comprise a further second recessed part relative to the other of the printed circuit board areas, and in a plane of the printed circuit board, wherein the further second recessed part is configured spatially separate from the second recessed part, wherein the second electrically conductive track is intercepted by the perforation line at the further second recessed part, wherein the further first recessed part and the further second recessed part share the same part of the perforation line.

The projection length of the protruding part relative to the recessed part as defined above especially in relation to the first protruding part and the first recessed part, defined in relation to the one of the two PCB areas and the first track (i.e. the first projection length), may independently apply to one or more of (i) the (second) projection length of the protruding part relative to the recessed part in relation to the second protruding part and the second recessed part, defined in relation to the other of the two PCB areas (as already indicated above) and the first track, (ii) the (further first) projection length of the protruding part relative to the recessed part in relation to the further first protruding part and the further first recessed part, defined in relation to the one of the two PCB areas and the second track, and (iii) the (further second) projection length of the protruding part relative to the recessed part in relation to the further second protruding part and the further second recessed part, defined in relation to the other of the two PCB areas and the second track.

Likewise, the shortest distance between two protruding parts as defined above especially in relation to the first protruding parts and the first recessed part, defined in relation to the one of the two PCB areas and the first track (i.e. the first shortest distance), may independently apply to one or more of (i) the (second) shortest distance between two protruding parts relative to the recessed part in relation to the second protruding parts and the second recessed part, defined in relation to the other of the two PCB areas (as already indicated above) and the first track, (ii) the (further first) shortest distance between two protruding parts relative to the recessed part in relation to the further first protruding parts and the further first recessed part, defined in relation to the one of the two PCB areas and the second track, and (iii) the (further second) shortest distance between two protruding parts relative to the recessed part in relation to the further second protruding parts and the further second recessed part, defined in relation to the other of the two PCB areas and the second track.

The phrase "the perforation line comprises in a plane of the printed circuit board and relative to one (or the other) of the printed circuit board areas, a projecting part and a recessed part" and similar phrases, may also be defined as that the one (or the other) of the printed circuit board areas comprise (in the plane of the printed circuit board) projecting part and a recessed part (relative to that one (or the other) PCB area).

As indicated above, it may be desirable to reassemble separated PCB areas. To this end, the perforation line may include shapes that allow fitting a part of one PCB area into a part of the other PCB area, which can only be achieved via movement perpendicular to the PCB areas. In other words, the PCB areas may include jigsaw puzzle elements that are complementary to each other. The jigsaw puzzle elements fit into each other. In such a way, the reassembled PCB areas may not be separated from each other due to a movement in the plane of the PCB area. Therefore, in embodiments the perforation line comprises a jigsaw puzzle element for facilitating reassembly of two physically separated printed circuit board area comprising parts. Especially, the perforation line provides complementary parts for two respective jigsaw elements.

As indicated above, an electronic component may be functionally coupled to the PCB area. Especially, in embodiments the electronic component may be a solid state light source. Hence, in embodiments to at least one of the two printed circuit board areas a solid state light source is functionally connected. The electronic component may be functionally connected to the first electrically conductive track. The electronic component may also be functionally coupled to the (optional) second electrically conductive track.

The same or different electronic components may be functionally coupled to each of the PCB areas. Hence, in embodiments to both of the two printed circuit board areas functional component are functionally connected, respectively.

In further specific embodiments, especially in view of scalability, the functional components of both of the two printed circuit board areas have identical functionality. When there are more than two printed circuit board areas, in embodiments all of the functional components of the printed circuit board areas have identical functionality. Hence, each PCB area may essentially have the same functionality. Hence, a 1D array of essentially identical PCB areas, provided as PCB, is herein provided in embodiments. Therefore, in specific embodiments the printed circuit board may comprise a plurality of sets of two printed circuit board areas, wherein the printed circuit board further comprises perforation lines between adjacent functional printed circuit board areas.

For reassembly, there may not be a (good) electrical connection between the first electrically conductive tracks of the two reassembled PCB areas. Hence, it may be necessary to provide—in addition to a physical coupling of the PCB areas, such as via the jigsaw puzzle element(s)—an electrical connection is provided. This may be achieved by soldering an electrical connection, such as via an electrical wire, or via a physical means, such as a clamp, which also provides electrical conductivity. To this end, e.g. solder hubs may be provided, which allow soldering of an electrical wire to such hub. Hence, in embodiments the first electrically conductive track is in electrical contact with two first solder hubs configured at different sides of the perforation line. Likewise, in embodiments the second electrically conductive track is in electrical contact with two second solder hubs configured at different sides of the perforation line.

Alternative or additional to the solder hubs, the PCB may include connectors, which may not be physically and electrically connected when the PCB areas are adjacent and not yet snapped away from each other, but which may be used for an electrical connection when the two separated PCB areas are reassembled. Hence, in yet further embodiments the first electrically conductive track is in electrical contact with two first connectors configured at different sides of the perforation line. Especially, the connectors are configurable as male-female electrical connection, though other options may also be possible. Likewise, in yet further embodiments the second electrically conductive track is in electrical contact with two second connectors configured at different sides of the perforation line. Especially, the connectors are configurable as male-female electrical connection, though other options may also be possible.

However, other configurations may also be possible. For instance, poke-in connectors or pin headers may be used. Connectors may e.g. also be used in combination with a connector element, such as a connector element for hosting poke-in connectors. Poke in connectors may require an additional wire to make the connection. Pin headers may be combined with dedicated jumpers or wires to make the connection. Further, the connectors may comprise dedicated male/female or hermaphrodite connectors, that break connection upon breaking, but which may be reconnected.

In yet a further aspect, the invention also provides a kit of parts comprising the printed circuit board as defined herein, especially comprising the above-defined solder hubs, and a connector for functionally coupling two physically separated printed circuit board area comprising parts, wherein the connector is configured to provide an electrically conductive connection between the two first solder hubs of the respective printed circuit board area comprising parts. Alternatively or additionally, the connector is configured to provide an electrically conductive connection between the two second solder hubs of the respective printed circuit board area comprising parts. Hence, in yet further embodiments, the kit of parts may comprise a plurality of connectors.

In yet a further embodiment, the invention also provides a method of customizing a printed circuit board as defined herein, wherein the method comprises breaking (or cutting) two adjacent PCB areas, along the perforation line in between them, apart. This may be done by applying a force. For instance a torque may be applied. Alternatively or additionally, also a cutting means may be applied. Hence, the invention provides a method of disconnecting a PCB area from another PCB area (thus especially leading to at least two PCB area comprising parts).

In yet another aspect, the invention also provides a method of functionally coupling two physically separated printed circuit board area comprising parts as defined herein, the method comprising providing an electrical contact between the two first solder hubs or the two first connectors configured at different printed circuit board area comprising parts. Alternatively or additionally, the invention also provides a method of functionally coupling two physically separated printed circuit board area comprising parts as defined herein, the method comprising providing an electrical contact between the two second solder hubs or the two second connectors configured at different printed circuit board area comprising parts. Hence, the invention provides a method of reassembling a PCB area to another PCB area (thus especially leading to at least two PCB area comprising parts (that are physically and/or electronically coupled).

Especially, the invention is herein described in relation to a perforation line. Alternatively or additionally to the perforation line, the PCB may include a V-groove scoring. A specific tool may be used to separate two PCB areas from each other, such as a kind of scissors or (other) (sharp) blade containing device.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily to scale.

DETAILED DESCRIPTION OF THE EMBODIMENTS

Figure 1A:
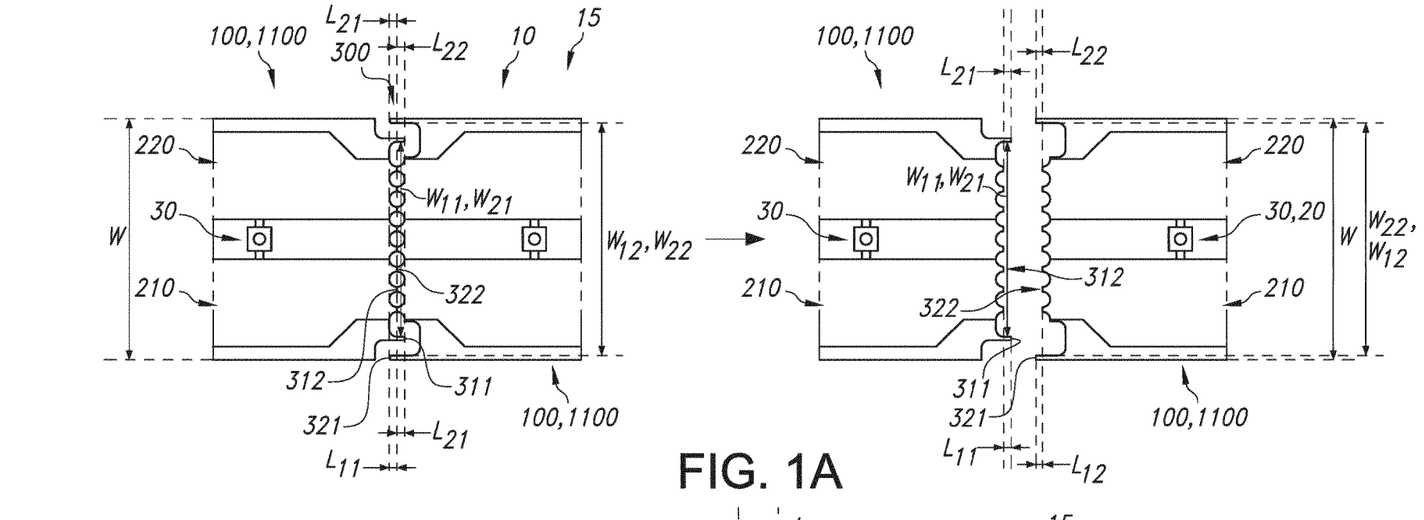
FIGS. 1a-1d schematically depict some aspects of the invention.

FIG. 1a very schematically depicts an embodiment of a printed circuit board 10 as described herein.

The printed circuit board 10 in this embodiment includes a first electrically conductive track 210. The printed circuit board 10 comprises a set 15 of two printed circuit board areas 100 both comprising a part of the first electrically conductive track 210. The printed circuit board 10 further comprises a perforation line 300 between the two printed circuit board areas 100. This can be used for customizing the printed circuit board 10 into two physically separated printed circuit board area comprising parts 1100, as shown on the right of the drawing.

The perforation line 300 is configured as a non-straight line. The perforation line 300 comprises relative to one of the printed circuit board areas 100, and in a plane of the printed circuit board 10, a first projecting part 311 and a first recessed part 312. The first recessed part 312 is recessed relative to the first projecting part 311. As schematically shown, the first electrically conductive track 210 is intercepted by the perforation line 300 at the first recessed part 312.

Figure 1B:
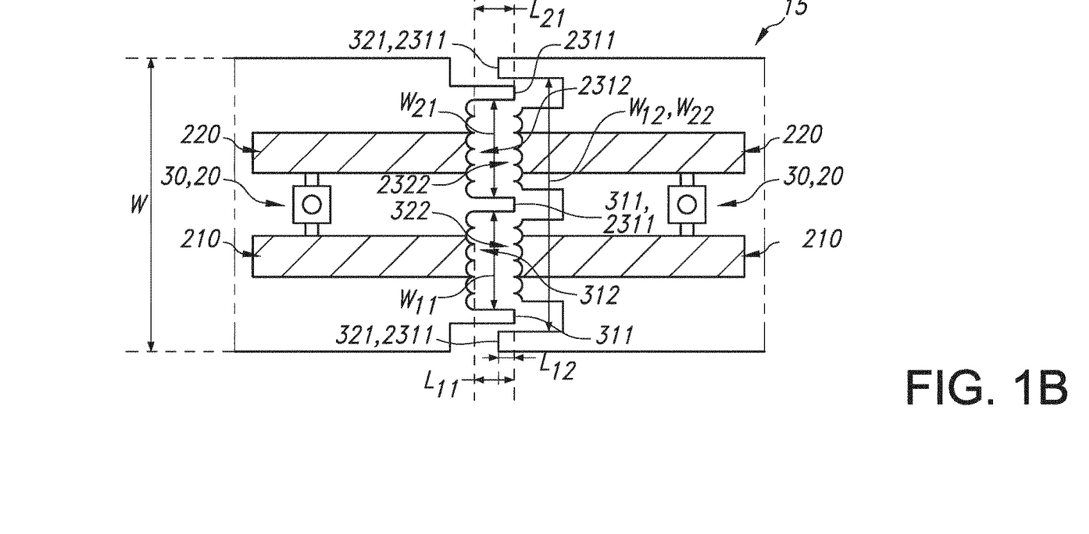
Figure 1C:
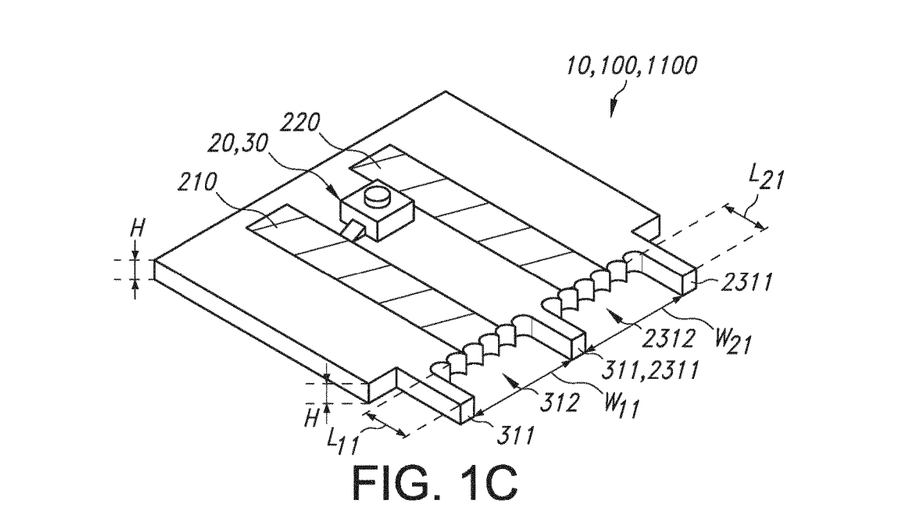

The perforation line 300 comprises through holes, having the same height as the PCB 10 or PCB areas 100 (see also FIG. 1c). These holes may have a circular cross-section, though this is not necessarily the case. Should the holes not have a circular cross-section, the diameter for the hole indicated above may be defined as a circular equivalent diameter. Further, the perforation line may also include other open shapes (having the same height as the PCB 10), which do not necessarily have a circular cross-section, such as shapes for providing a projecting part and/or a jigsaw puzzle element (see also below).

As also shown in FIG. 1a, in embodiments the printed circuit board 10 comprises a plurality of first projecting parts 311 (in the plane of the printed circuit board 10), wherein the first electrically conductive track 210 is intercepted by the perforation line 300 at the first recessed part 312 between two first projecting parts 311.

The printed circuit board 10 has a width W. Further, the two first projecting parts 311 may have a shortest distance W11.

The first projecting part 311 has a projection length L11 (in the plane of the printed circuit board 10) relative the first recessed part 312 (which is recessed relative to that first projecting part 311).

In FIG. 1a, the left PCB area 100 may be indicated as the one of the printed circuit board areas 100 (or the first PCB area 100) and the right PCB area 100 may be indicated as the other of the printed circuit board areas 100 (or may be indicated as the second PCB area 100), which are broken away from each other in the right part of the drawing (i.e. right of the arrow in the middle of the drawing).

As shown in FIG. 1a, the perforation line 300 comprises in a plane of the printed circuit board 10 and relative to the other of the printed circuit board areas 100, a second projecting part 321 and a second recessed part 322. The second recessed part 322 is recessed relative to the second projecting part 321. Further, the first electrically conductive track 210 is intercepted by the perforation line 300 at the second recessed part 322. As shown in the left part of the drawing, the first recessed part 312 and the second recessed part 322 share the same part of the perforation line 300.

Actually, the printed circuit board 10 comprises a plurality of second projecting parts 321 (relative to the other of the printed circuit board areas 100). The first electrically conductive track 210 is intercepted by the perforation line 300 at the second recessed part 322 between two second projecting parts 321.

As also shown in FIGS. 1a and 1b, the printed circuit board 10 may in embodiments further comprise a second electrically conductive track 220, different from the first electrically conductive track. The set 15 of two printed circuit board areas 100 both comprise a part of the second electrically conductive track 220. Similarly as above in relation to the first track, the second electrically conductive track 220 is intercepted by the perforation line 300 at the first recessed part 312 or at a further first recessed part 2312, see FIG. 1b, relative to one of the printed circuit board areas 100, and in a plane of the printed circuit board 10. In FIG. 1b, it is shown that the further first recessed part 2312 may be configured spatially separate from the first recessed part 312, whereas in the embodiment of FIG. 1a there is only a single first recessed part 312.

Referring to FIG. 1b, an embodiment is schematically depicted wherein the printed circuit board 10, further comprises a further second recessed part 2322 relative to the other of the printed circuit board areas 100, and in a plane of the printed circuit board 10. The further second recessed part 2322 is configured spatially separate from the second recessed part 322. The second electrically conductive track 220 is intercepted by the perforation line 300 at the further second recessed part 2322, wherein the further first recessed part 2312 and the further second recessed part 2322 share the same part of the perforation line 300. Note that the first recessed part 312 and the further first recessed part 2312 are separated by a projecting part, which is a first projecting part 311 for the first recessed part and which is a further first projecting part 2311 for the second recessed part. In contrast, in this schematically depicted embodiment the second recessed part 2312 and the further second recessed part 2312 are not separated by a projecting part, and are both configured between second projecting parts 321, which are at the same time thus also further second projecting parts 2321.

Referring to FIGS. 1a and 1b, one or both of the two printed circuit board areas 100 may functionally be connected to a functional component 30 (or the functional components are functionally connected to the two printed circuit board areas 100, respectively). In specific embodiments, the functional components 30 of both of the two printed circuit board areas 100 have identical functionality.

In specific embodiments, at least one of the two printed circuit board areas 100 a solid state light source 20 is functionally connected. Here, this applies to both the printed circuit board areas 100.

FIGS. 1a and 1b show e.g. a top face of embodiments of the PCB.

For the sake of understanding, the schematically depicted embodiment of FIG. 1b is shown in the broken away configuration. In the non-broken way configuration the perforations are closed, and there may be channels between the projecting part of the one PCB area and the other PCB area (and the other way around).

FIG. 1c very schematically depicts the embodiment of FIG. 1b, left PCB area 100 (the first PCB area 100) in perspective. The height of the PCB is indicated with reference H. The recessed parts and the projecting parts are over the entire height H of the PCB area 100. As also indicated above, the perforation line 300—here in face in a broken away configuration—comprises through holes, having the same height as the PCB 10 or PCB areas 100.

Figure 1D:
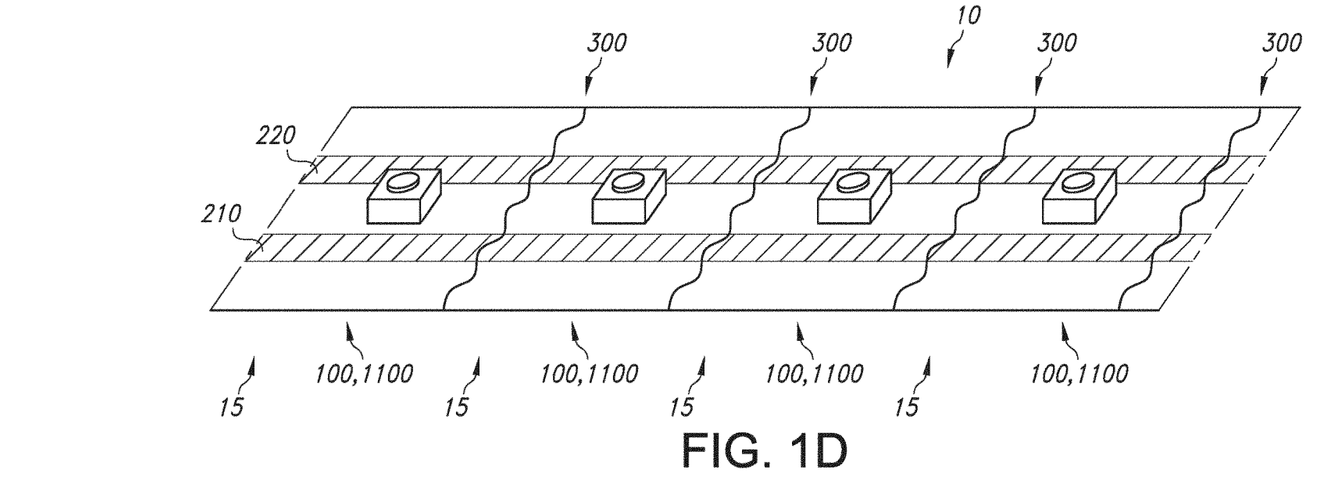

FIG. 1d schematically depicts an embodiment of the printed circuit board 10, comprising a plurality of sets 15 of two printed circuit board areas 100. The printed circuit board 10 further comprises perforation lines 300 between adjacent functional printed circuit board areas 100. As shown, in this embodiment the printed circuit board 10 comprises a 1D array of printed circuit board areas 100. Hence, FIG. 1d schematically depicts an embodiment with at least 4 PCB areas 100 (or PCB modules).

FIGS. 1c and 1d show e.g. a top face of embodiments of the PCB in (some) perspective (see also FIGS. 1a-1c with which these embodiments may be related).

Figure 2A:
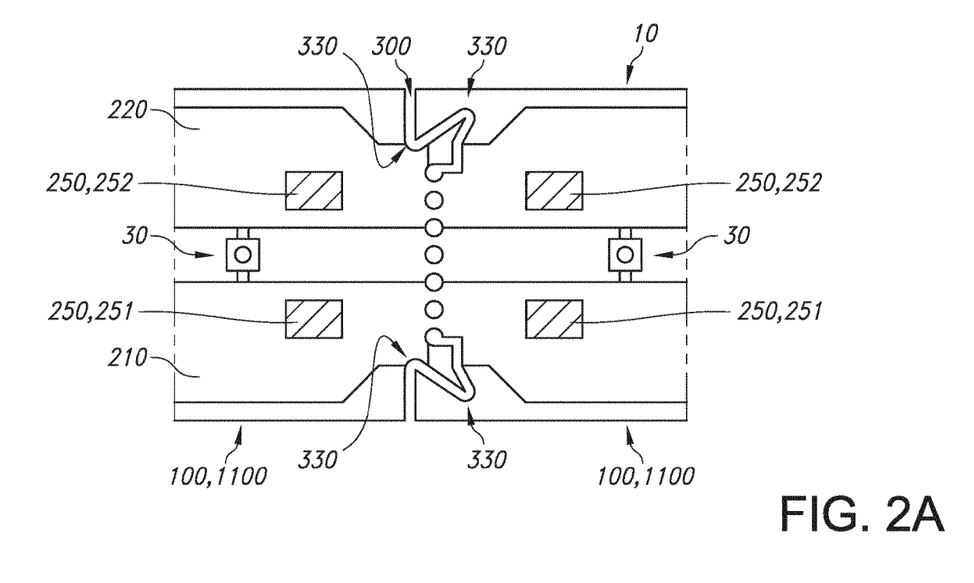
FIGS. 2a-2b schematically depict some further aspects of the invention.

FIG. 2a schematically depicts an embodiment wherein the perforation line 300 comprises a jigsaw puzzle element 330 for facilitating reassembly of two physically separated printed circuit board area comprising parts 1100. Hence, in embodiments the PCB areas 100 (or PCB area comprising parts 1100) may comprise jigsaw puzzle elements 330 for facilitating reassembly of two physically separated PCB areas 100 (or PCB area comprising parts 1100). In this way, areas 100 that have been separated from each other may also be reassembled. The jigsaw puzzle elements 330, however, allow fitting a part of one PCB area into a part of the other PCB area, which can only be achieved via movement perpendicular to the PCB areas.

Figure 2B:
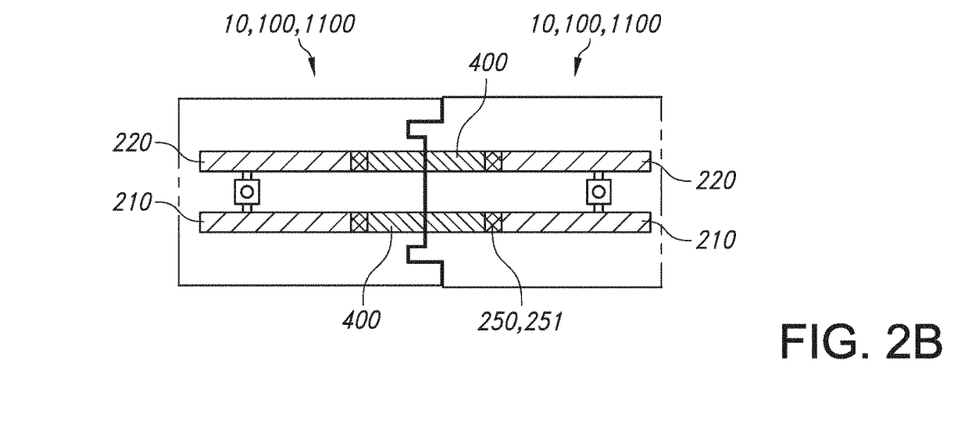

FIGS. 2a and 2b schematically depict embodiments wherein the first electrically conductive track 210 is in electrical contact with two solder hubs 250, herein indicated as first solder hubs 251 configured at different sides of the perforation line 300. Likewise, the second electrically conductive track 210 is in electrical contact with two solder hubs 250, herein indicated as second solder hubs 252 configured at different sides of the perforation line 300.

Alternatively or additionally, but not schematically depicted herein, the first electrically conductive track 210 may be in electrical contact with two first connectors configured at different sides of the perforation line 300, wherein the connectors are configurable as male-female electrical connection. Likewise, but not schematically depicted herein, the second electrically conductive track 220 may be in electrical contact with two second connectors configured at different sides of the perforation line 300. Especially, such connectors may be configurable as male-female electrical connection, though other solutions, such as poke-in connectors, may also be possible.

As shown in FIG. 2b, between the hubs 250 (the four cross-hatched areas) electrical connections 400 are configured, e.g. an isolated electrical wire soldered to the hubs, or a complete soldering track, for providing electrical contact between the conductive track at both sides of the interface formed by the reassembled PCB areas 100.

Hence, the invention also provides a kit of parts 777 comprising the printed circuit board 10 and a connector 400 for functionally coupling two physically separated printed circuit board area comprising parts 1100. As shown above, the connector 400 may be used to provide an electrically conductive connection 410 between the two first solder hubs 251 of the respective printed circuit board area comprising parts 1100.

Herein, especially attention is provided to the one PCB area with the first track, the first projection and the first recession, such as the projection length, or, when two projection parts are available the shortest distance there between. However, such embodiments may also apply to the second track (if available) on the one PCB area. However, such embodiments may also apply to the first track on the other PCB area. However, such embodiments may also apply to the second track (if available) on the other PCB area. Likewise, embodiments described in relation to the one PCB area may also apply to the second PCB area.

For instance, the conditions as described above in relation to the widths and/or length may apply for both tracks and/or both adjacent areas that are "separated" by the perforation line. For instance, one or more of the following may apply: (i) W11<W, and especially (ii) W11≤25 mm; (i) W21<W, and especially (ii) W21≤25 mm; (i) W12<W, and especially (ii) W12≤25 mm; and (i) W22<W, and especially (ii) W22≤25 mm. Likewise, one or more of the following may apply: (i) L11≥0.5 mm, and/or (ii) L11≥0.1*W; (i) L21≥0.5 mm, and/or (ii) L21≥0.1*W; (i) L12≥0.5 mm, and/or (ii) L12≥0.1*W; and (i) L22≥0.5 mm, and/or (ii) L22≥0.1*W.

Hence, the invention also provides a luminaire and a lamp which comprises a a printed circuit board 10 or a kit of parts 777 as defined herein.

The printed circuit board may be monolithic.

The terms "recess" or "recessed" means a small space created by the printed circuit board further back from the rest. The recess may also be a cavity. Preferably both or all first electrically conductive tracks which are intercepted by perforation lines are recessed relative to the projecting parts.

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" includes also embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein. In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention claimed is:

1. A printed circuit board including a first electrically conductive track, wherein the printed circuit board comprises a set of two printed circuit board areas both comprising a part of the first electrically conductive track, wherein printed circuit board further comprises a perforation line between the two printed circuit board areas for customizing the printed circuit board into two physically separated printed circuit board area comprising parts, wherein the perforation line is configured as a non-straight line, wherein the perforation line comprises relative to one of the printed circuit board areas, and in a plane of the printed circuit board, a first projecting part and a first recessed part, wherein the first recessed part is recessed relative to the first projecting part, wherein the first electrically conductive track is intercepted by the perforation line at the first recessed part, and wherein the perforation line comprises in a plane of the printed circuit board and relative to the other of the printed circuit board areas, a second projecting part and a second recessed part, wherein the second recessed part is recessed relative to the second projecting part, wherein the first electrically conductive track is intercepted by the perforation line at the second recessed part, wherein the first recessed part and the second recessed part share the same part of the perforation line.

2. The printed circuit board according to claim 1, comprising a plurality of first projecting parts, wherein the first electrically conductive track is intercepted by the perforation line at the first recessed part between two first projecting parts.

3. The printed circuit board according to claim 2, wherein the printed circuit board has a width (W), wherein the two first projecting parts have a shortest distance, wherein the shortest distance complies with the following conditions: (i) W11<W, and (ii) W11≤25 mm.

4. The printed circuit board according to claim 1, wherein the printed circuit board has a width (W), wherein the first projecting part has a projection length relative the first recessed part, wherein the projection length complies with at least one of the following conditions: (i) L11≥0.5 mm, and (ii) L11≥0.1*W.

5. The printed circuit board according to claim 1, further comprising a second electrically conductive track, different from the first electrically conductive track, wherein the set of two printed circuit board areas both comprise a part of the second electrically conductive track, wherein the second electrically conductive track is intercepted by the perforation line at (i) the first recessed part or (ii) at a further first recessed part relative to one of the printed circuit board areas, and in a plane of the printed circuit board, wherein the further first recessed part is configured spatially separate from the first recessed part.

6. The printed circuit board according to claim 5, further comprising a further second recessed part relative to the other of the printed circuit board areas, and in a plane of the printed circuit board, wherein the further second recessed part is configured spatially separate from the second recessed part, wherein the second electrically conductive track is intercepted by the perforation line at the further second recessed part, wherein the further first recessed part and the further second recessed part share the same part of the perforation line.

7. The printed circuit board according to claim 1, wherein the perforation line comprises a jigsaw puzzle element for facilitating reassembly of two physically separated printed circuit board area comprising parts.

8. The printed circuit board according to claim 1, wherein to at least one of the two printed circuit board areas a solid state light source is functionally connected.

9. The printed circuit board according to claim 1, wherein to both of the two printed circuit board areas functional component are functionally connected, respectively, and wherein the functional components of both of the two printed circuit board areas have identical functionality.

10. The printed circuit board according to claim 1, comprising a plurality of sets of two printed circuit board areas, wherein the printed circuit board further comprises perforation lines between adjacent functional printed circuit board areas, and wherein the printed circuit board comprises a 1D array of printed circuit board areas.

11. The printed circuit board according to claim 1, wherein the first electrically conductive track is in electrical contact with two first solder hubs configured at different sides of the perforation line.

12. A method of functionally coupling two physically separated printed circuit board area comprising parts as defined in claim 11, the method comprising providing an electrical contact between the two first solder hubs or the two first connectors configured at different printed circuit board area comprising parts.

13. The printed circuit board according to claim 1, wherein the first electrically conductive track is in electrical contact with two first connectors configured at different sides of the perforation line, wherein the connectors are configurable as male-female electrical connection.

14. A kit of parts comprising the printed circuit board according to claim 13 and a connector for functionally coupling two physically separated printed circuit board area comprising parts, wherein the connector is configured to provide an electrically conductive connection between the two first solder hubs of the respective printed circuit board area comprising parts.

15. A lamp or a luminaire comprising a printed circuit board according to claim 1, or a kit of parts.

* * * * *